United States Patent
Sun et al.

(10) Patent No.: US 12,538,693 B2
(45) Date of Patent: Jan. 27, 2026

(54) LIGHT EMITTING PANEL AND MANUFACTURING METHOD THEREOF, AND LIGHT EMITTING APPARATUS

(71) Applicant: BOE Technology Group Co., Ltd., Beijing (CN)

(72) Inventors: Zhongyuan Sun, Beijing (CN); Wenqi Liu, Beijing (CN); Che An, Beijing (CN); Qian Wu, Beijing (CN); Wei Huang, Beijing (CN); Zhiqiang Jiao, Beijing (CN); Guangcai Yuan, Beijing (CN); Chunyan Li, Beijing (CN); Jingjing Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 386 days.

(21) Appl. No.: 18/026,494

(22) PCT Filed: Jun. 29, 2022

(86) PCT No.: PCT/CN2022/102479
§ 371 (c)(1),
(2) Date: Mar. 15, 2023

(87) PCT Pub. No.: WO2024/000305
PCT Pub. Date: Jan. 4, 2024

(65) Prior Publication Data
US 2024/0373725 A1    Nov. 7, 2024

(51) Int. Cl.
*H10K 59/00* (2023.01)
*H10K 59/35* (2023.01)
(Continued)

(52) U.S. Cl.
CPC ........... *H10K 59/879* (2023.02); *H10K 59/35* (2023.02); *H10K 59/38* (2023.02); *H10K 59/873* (2023.02); *H10K 2102/351* (2023.02)

(58) Field of Classification Search
CPC ............. H10K 59/873; H10K 59/8731; H10K 59/879; H10K 59/35; H10K 59/38
See application file for complete search history.

(56) References Cited

U.S. PATENT DOCUMENTS

| 10,991,769 B2 | 4/2021 | Lee et al. |
| 2012/0002286 A1 | 1/2012 | Tanikawa |

(Continued)

FOREIGN PATENT DOCUMENTS

| CN | 1945402 A | * | 4/2007 |
| CN | 108336241 A | | 7/2018 |

(Continued)

OTHER PUBLICATIONS

"Close." Merriam-Webster.com. 2025. http://www.merriam-webster.com/dictionary/close (Jun. 3, 2025). (Year: 2025).*

(Continued)

*Primary Examiner* — Reema Patel
(74) *Attorney, Agent, or Firm* — WHDA, LLP

(57) ABSTRACT

A light emitting panela includes: a light emitting substrate including at least one light emitting region and a non-light-emitting region surrounding the light emitting region; and an encapsulation layer arranged on a light exiting side of the light emitting substrate, wherein the encapsulation layer includes a first film layer including a plurality of pillars separated from each other and a first medium arranged in gaps between the pillars; wherein a refractive index of the pillars is different from that of the first medium, and a volume ratio of the pillars to the first medium gradually increases or decreases along a first direction, so that an equivalent refractive index of the first film layer gradually decreases along the first direction, the first direction being a direction from a center of the light emitting region to an edge of the light emitting region.

18 Claims, 7 Drawing Sheets

(51) Int. Cl.
*H10K 59/38* (2023.01)
*H10K 59/80* (2023.01)
*H10K 102/00* (2023.01)

(56) References Cited

U.S. PATENT DOCUMENTS

| | | | |
|---|---|---|---|
| 2017/0170248 A1* | 6/2017 | Sato | G09G 3/3266 |
| 2020/0167015 A1 | 5/2020 | Fukutome et al. | |
| 2020/0251688 A1 | 8/2020 | Chung et al. | |
| 2020/0365833 A1* | 11/2020 | Joo | H10K 59/8731 |
| 2022/0029128 A1 | 1/2022 | Gu et al. | |
| 2023/0006178 A1 | 1/2023 | Liu et al. | |

FOREIGN PATENT DOCUMENTS

| | | |
|---|---|---|
| CN | 207834302 U | 9/2018 |
| CN | 110828517 A | 2/2020 |
| CN | 210576029 U | 5/2020 |
| CN | 111490180 A | 8/2020 |
| CN | 111525041 A | 8/2020 |
| CN | 111816789 A | 10/2020 |

OTHER PUBLICATIONS

"Gradual." Merriam-Webster.com. 2025. http://www.merriam-webster.com/dictionary/gradual (Jun. 3, 2025). (Year: 2025).*

* cited by examiner

LIGHT EMITTING PANEL AND MANUFACTURING METHOD THEREOF, AND LIGHT EMITTING APPARATUS

TECHNICAL FIELD

The present application relates to the technical field of display, and particularly relates to a light emitting panel and a manufacturing method thereof, and a light emitting apparatus.

BACKGROUND

An organic light emitting diode (OLED) is an active light-emitting device, which has the advantages of self-illumination, wide viewing angle, fast response time, high light-emitting efficiency, low working voltage and simple manufacturing process, and is known as the next-generation "star" light emitting device.

SUMMARY

The present application provides a light emitting panel, including:
- a light emitting substrate including at least one light emitting region and a non-light-emitting region surrounding the light emitting region; and
- an encapsulation layer arranged on a light exiting side of the light emitting substrate, wherein the encapsulation layer includes a first film layer including a plurality of pillars separated from each other and a first medium arranged in gaps between the pillars;
- wherein a refractive index of the pillars is different from that of the first medium, and a volume ratio of the pillars to the first medium gradually increases or decreases along a first direction, so that an equivalent refractive index of the first film layer gradually decreases along the first direction, the first direction being a direction from a center of the light emitting region to an edge of the light emitting region.

In an alternative implementation, the refractive index of the pillars is greater than that of the first medium, and the volume ratio of the pillars to the first medium gradually decreases along the first direction; or,
- the refractive index of the pillars is less than that of the first medium, and the volume ratio of the pillars to the first medium gradually increases along the first direction.

In an alternative implementation, the refractive index of the pillars is greater than that of the first medium; along the first direction, sizes of the pillars gradually decrease or remain unchanged.

In an alternative implementation, the light emitting region is provided with a first side and a second side that are adjacent, and the first side is greater than or equal to the second side;
- along a direction from the center of the light emitting region to the first side, a size attenuation rate of the pillars is a first rate;
- along a direction from the center of the light emitting region to the second side, the size attenuation rate of the pillars is a second rate;
- wherein the first rate is greater than or equal to the second rate.

In an alternative implementation, the difference between a maximum value of the equivalent refractive index and a minimum value of the equivalent refractive index of the first film layer is greater than or equal to 0.4, and less than or equal to 1.5.

In an alternative implementation, orthographic projections of the plurality of pillars and the first medium on the light emitting substrate cover the at least one light emitting region and at least part of the non-light-emitting region.

In an alternative implementation, the encapsulation layer further includes: a barrier layer and a spacer layer stacked between the light emitting substrate and the first film layer, and the barrier layer is disposed close to the light emitting substrate; and
- the first film layer further includes a film layer body located on a side of the plurality of pillars close to the light emitting substrate, and the film layer body and the pillars are integrally structured.

In an alternative implementation, the barrier layer, the spacer layer and the first film layer each independently include at least one of the following materials: silicon nitride, silicon oxide, silicon oxynitride, alumina, silicon carbon nitrogen, titanium oxide, zirconium oxide, parylene, acrylic series organics and epoxy resin series organics.

In an alternative implementation, the light emitting panel further includes:
- a leveling layer arranged on a side of the first film layer away from the light emitting substrate;
- wherein, the first medium includes gas and/or a material of the leveling layer filled in the gaps between the pillars.

In an alternative implementation, the refractive index of the pillars is greater than or equal to 1.5, and less than or equal to 2.5; the refractive index of the first medium is greater than or equal to 1.0, and less than or equal to 1.5.

In an alternative implementation, in a normal direction of the light emitting substrate, a thickness of the pillars is greater than or equal to 300 nm and less than or equal to 4000 nm; and/or
- in a direction parallel to a plane where the light emitting substrate is located, sizes of the pillars are greater than or equal to 60 nm and less than or equal to 400 nm; and/or
- a minimum distance between two adjacent pillars is greater than or equal to 20 nm and less than or equal to 400 nm.

In an alternative implementation, in a normal direction of the light emitting substrate, a thickness of the encapsulation layer is less than or equal to 4000 mm.

In an alternative implementation, a viewing angle range of the light emitting panel is less than that of the light emitting substrate, and the viewing angle range of the light emitting panel is less than or equal to 30°.

In an alternative implementation, the light emitting panel includes a plurality of pixels, and each of the plurality of pixels includes a red sub-pixel, a blue sub-pixel and a green sub-pixel; the light emitting panel further includes:
- a color conversion layer arranged on the light exiting side of the encapsulation layer, and including:
- a first color conversion pattern in the red sub-pixel, for emitting red light when excited by incident light;
- a second color conversion pattern in the green sub-pixel, for emitting green light when excited by the incident light: and
- a transmissive pattern, in the blue sub-pixel, for transmitting the incident light;
- wherein the incident light includes blue light.

In an alternative implementation, the first color conversion pattern and the second color conversion pattern each independently include at least one of the following materials: quantum dots, rare earth materials, fluorescent materials, and organic dyes.

In an alternative implementation, further including:
a color filter layer arranged on the light exiting side of the color conversion layer, and including:
a first color filter pattern in the red sub-pixel, for transmitting the red light incident to the first color filter pattern;
a second color filter pattern in the green sub-pixel, for transmitting the green light incident on the second color filter pattern; and
a third color filter pattern in the blue sub-pixel, for transmitting the blue light incident to the third color filter pattern.

In an alternative implementation, the light emitting substrate includes:
a first substrate baseplate;
a plurality of switching elements disposed on the first substrate baseplate; and
a plurality of light emitting devices connected to the switching elements, wherein the light emitting devices are in the light emitting region; wherein the encapsulation layer is located on a light exiting side of the light emitting devices;
the light emitting panel further includes:
a second substrate baseplate disposed on a side of the color filter layer away from the color conversion layer; and
a leveling layer arranged between the encapsulation layer and the color conversion layer, for bonding the encapsulation layer and the color conversion layer.

The present application provides a light emitting apparatus, including:
the light emitting panel according to any one of claims 1 to 17;
a driving integrated circuit configured to provide a driving signal to the light emitting panel; and
a power supply circuit configured to provide power to the light emitting panel.

The present application provides a method for manufacturing a light emitting panel, including:
providing a light emitting substrate including at least one light emitting region and a non-light-emitting region surrounding the light emitting region;
forming an encapsulation layer on a light exiting side of the light emitting substrate, wherein the encapsulation layer includes a first film layer, the first film layer includes a plurality of pillars separated from each other and a first medium arranged in gaps between the pillars; a refractive index of the pillars is different from that of the first medium, and a volume ratio of the pillars to the first medium gradually increases or decreases along a first direction, so that an equivalent refractive index of the first film layer gradually decreases along the first direction, the first direction is a direction from a center of the light emitting region to an edge of the light emitting region.

In an alternative implementation, the step of forming an encapsulation layer on a light exiting side of the light emitting substrate includes:
forming an encapsulation material layer on the light exiting side of the light emitting substrate, wherein an orthographic projection of the encapsulation material layer on the light emitting substrate covers the light emitting substrate;
forming a metal layer on a side of the encapsulation material layer away from the light emitting substrate, wherein an orthographic projection of the metal layer on the light emitting substrate covers the light emitting substrate;
using a nanoimprint process to form a protective adhesive layer by patterning on a side of the metal layer away from the light emitting substrate;
etching the metal layer by using the protective adhesive layer as a mask to obtain a patterned metal layer;
etching the encapsulation material layer by using the patterned metal layer as a mask to form the plurality of pillars; and
removing the patterned metal layer to form the first film layer; wherein, the plurality of pillars and the first medium filled in the gaps between the pillars constitute the first film layer.

The above description is merely a summary of the technical solutions of the present application. In order to more clearly know the technical means of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly described below. Apparently, the figures that are described below are embodiments of the present application, and a person skilled in the art can obtain other figures according to these figures without paying creative work.

DETAILED DESCRIPTION

In order to make the purpose, technical solutions and advantages of the embodiments of the present application clearer, the technical solutions in the embodiments of the present application will be described clearly and completely in combination with the drawings in the embodiments of the present application. Obviously, the described embodiments are part of the embodiments of the present application, not all of them. Based on the embodiments in the present application, all other embodiments obtained by ordinary technicians in the art without creative work fall within the scope of protection of the present application.

Figure 1:
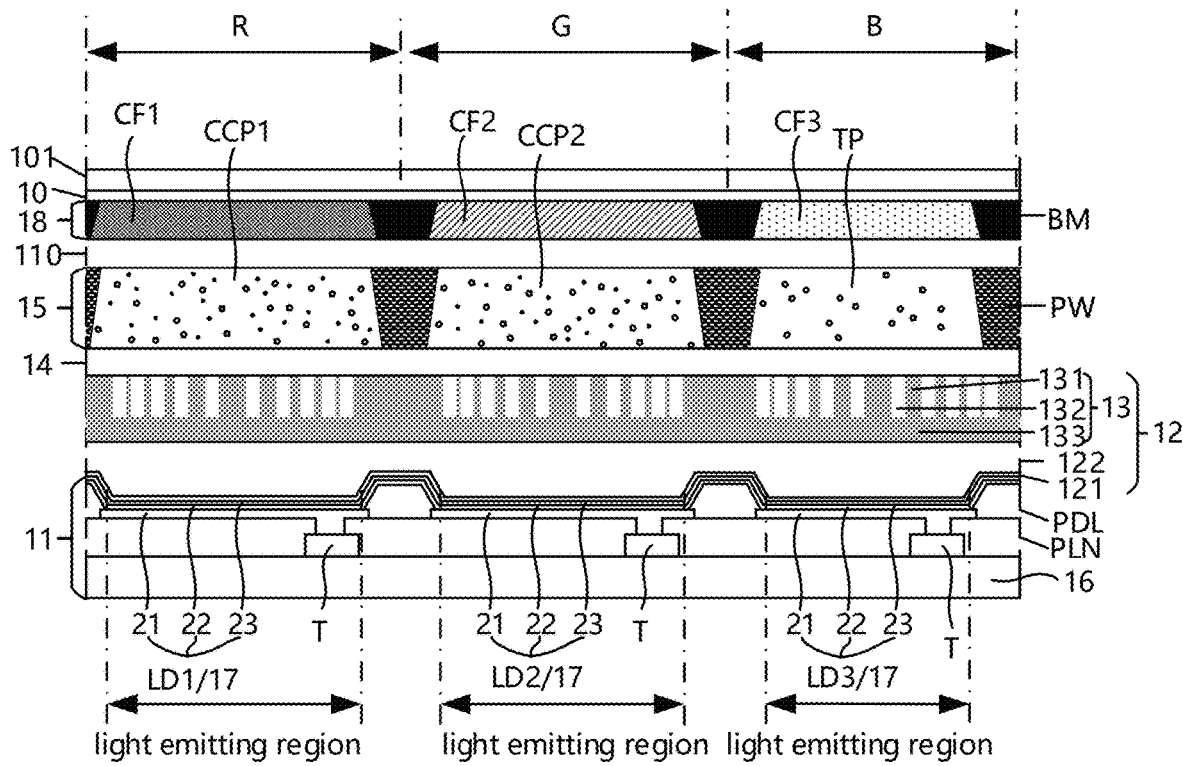
FIG. 1 schematically shows a schematic cross-sectional structure diagram of a first light emitting panel provided by the present application.
Figure 2:
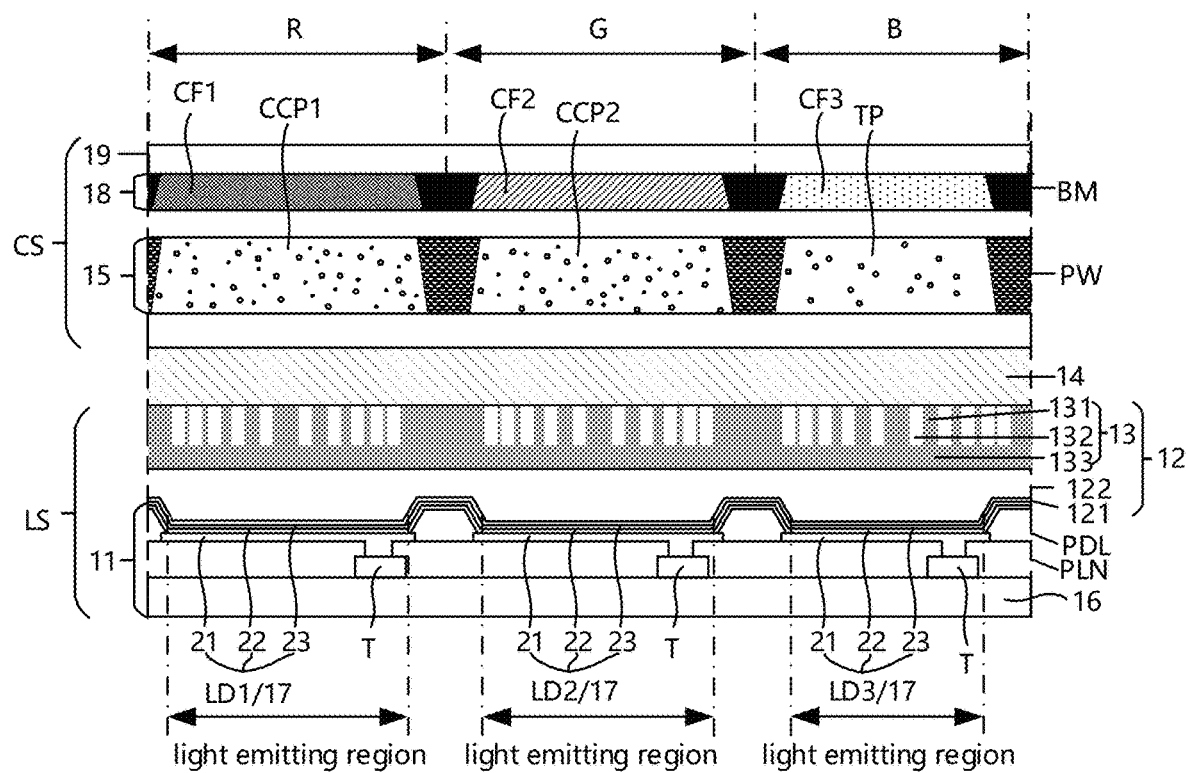
FIG. 2 schematically shows a schematic cross-sectional structure diagram of a second light emitting panel provided by the present application.

The present application provides a light emitting panel, and FIGS. 1 and 2 schematically show schematic cross-sectional structure diagrams of two examples of the light emitting panel provided by the present application. As shown in FIG. 1 or FIG. 2, the light emitting panel includes: a light emitting substrate 11 including at least one light emitting region and a non-light-emitting region surrounding the light emitting region; and an encapsulation layer 12 arranged on a light exiting side of the light emitting substrate 11, wherein the encapsulation layer 12 includes a first film layer 13, the first film layer 13 includes a plurality of pillars 131 separated from each other and a first medium 132 arranged in gaps between the pillars.

Figure 3:
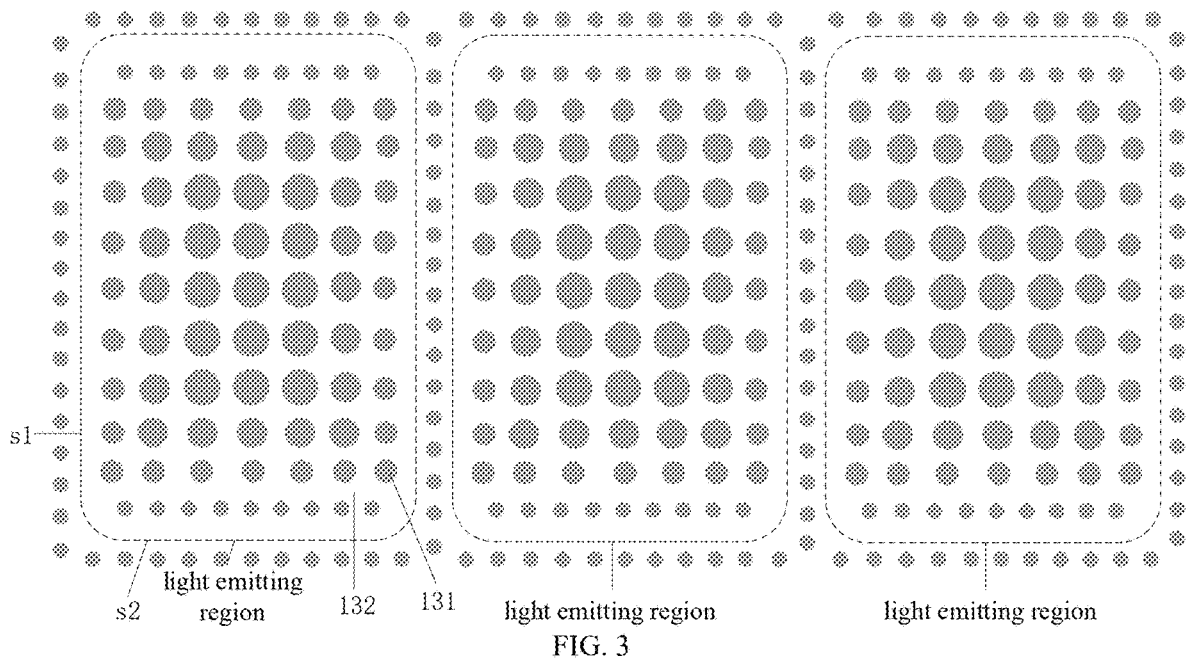
FIG. 3 schematically shows a schematic plan structure diagram of an example of a first film layer.

Wherein, the refractive index of the pillar 131 is different from that of the first medium 132. FIG. 3 schematically shows a schematic plan structure view of an example of the first film layer. As shown in FIG. 3, the volume ratio of the pillar 131 to the first medium 132 gradually increases or decreases along a first direction, so that the equivalent refractive index of the first film layer 13 gradually decreases along the first direction, wherein the first direction is a direction from the center of the light emitting region to the edge of the light emitting region.

The volume ratio of the pillar 131 to the first medium 132 refers to the ratio between the volume of the pillar 131 and the volume of the first medium 132.

The encapsulation layer 12 is used to prevent water and oxygen from invading the light emitting substrate 11, and the orthographic projection of the encapsulation layer 12 on the light emitting substrate 11 can cover the entire light emitting substrate 11.

Figure 4:
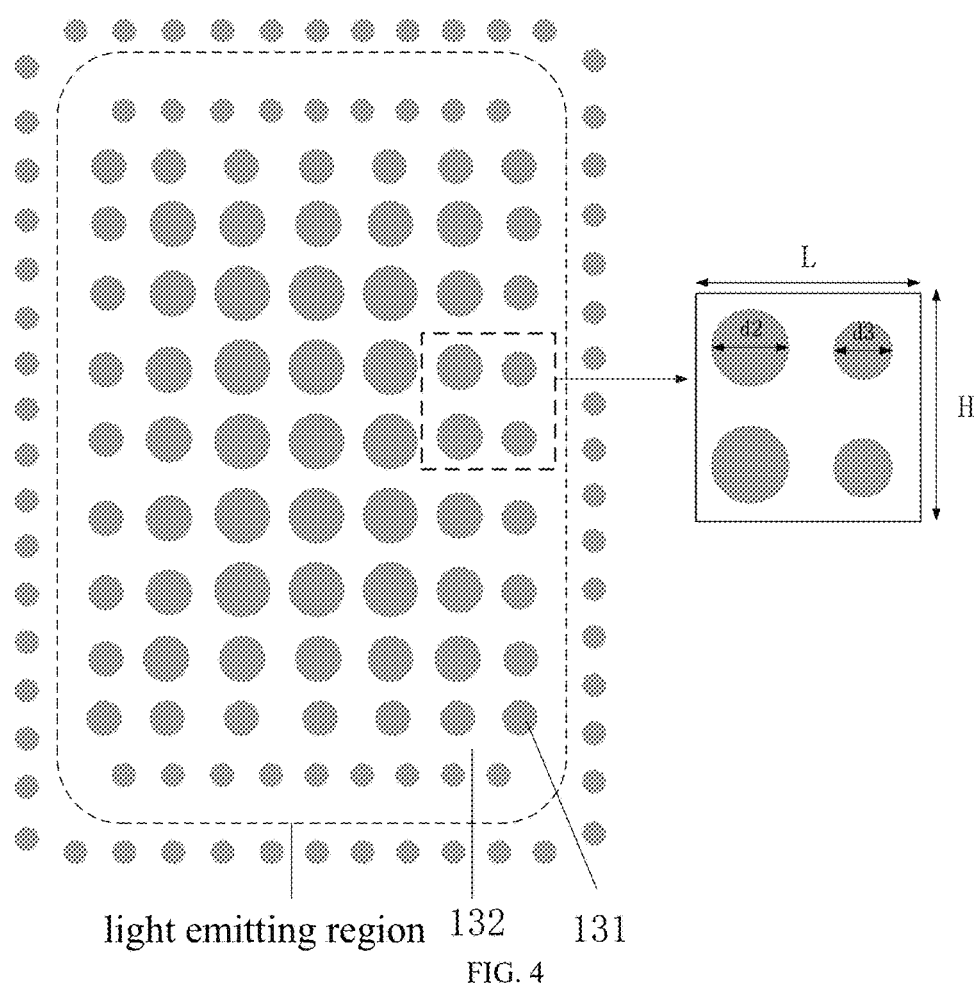
FIG. 4 schematically shows a schematic plan structure diagram of a target region in the first film layer.

Select a target region with a length of H and a width of L in the plan view shown in FIG. 3, and as shown in FIG. 4, the pillars 131 in the target region are cylinders, in which the diameter of N1 (N1 is 2 in FIG. 4) cylinders is d2, the diameter of N2 (N2 is 2 in FIG. 4) cylinders is d3, and the height of each cylinder is h.

Taking the target region as an example, the volume ratio of the pillar 131 to the first medium 132 and the equivalent refractive index of the first film layer 13 will be described below.

The total volume of the target region is: $V=S\times h$, wherein S is the area of the orthographic projection of the target region on the plane where the light emitting substrate 11 is located.

The volume of the pillars 131 in the target region is: $V1=S1\times h$, wherein S1 is the area of the orthographic projections of all the pillars 131 in the target region on the plane where the light emitting substrate 11 is located, $S1=N1\times\pi\times(d2/2)^2+N2\times\pi\times(d3/2)^2$.

The volume of the first medium 132 in the target region is: $V2=V-V1$.

In the target region, the volume ratio of the pillars 131 to the first medium 132 is $V1/V2$.

The equivalent refractive index of the first film layer 13 in the target region is: $n=n1\times(V1/V)+n2\times(V2/V)$, wherein n1 is the refractive index of the pillars 131, and n2 is the refractive index of the first medium 132.

According to the calculation formula of the equivalent refractive index, it can be seen that when the refractive index n1 of the pillars 131 is not equal to the refractive index n2 of the first medium 132, by adjusting the value of the volume ratio of the pillars 131 to the first medium 132 in different regions, the equivalent refractive index of the first film layer 13 in different regions can be adjusted.

For example, in a first target region of the first film layer 13, the volume V1 of the pillars 131 is much larger than the volume V2 of the first medium 132, and the equivalent refractive index n of the first target region will be infinitely close to the refractive index n1 of the pillars 131; in a second target region of the first film layer 13, the volume V1 of the pillars 131 is much smaller than the volume V2 of the first medium 132, and the equivalent refractive index n of the second target region will be infinitely close to the refractive index n2 of the first medium 132.

Since the refractive index of the pillars 131 is different from that of the first medium 132, by setting the volume ratio of the pillars 131 to the first medium 132 to gradually increase or decrease along the first direction, it may realize that the equivalent refractive index of the first film layer 13 decreases gradually along the first direction.

In the present application, since the equivalent refractive index of the first film layer 13 gradually decreases along the first direction, the multiple pillars 131 corresponding to the same light emitting region and the first medium 132 filled in the gaps between these pillars are equivalent to a micro lens, which may converge the incident light, deflect a large viewing angle light emitted by the light emitting region to a small viewing angle range, and reduce the lateral propagation of the light emitted by the light emitting region, thereby avoiding cross-color among sub-pixels of different colors.

It should be noted that the micro lens mentioned below refers to a plurality of pillars 131 corresponding to the same light emitting region and the first medium 132 filled in the gaps between these pillars. The micro lens corresponds to the light emitting region one by one.

In addition, the lateral direction mentioned herein refers to the direction parallel to the plane where the light emitting substrate is located, and the vertical direction refers to the direction along the normal line of the light emitting substrate.

Figure 7:
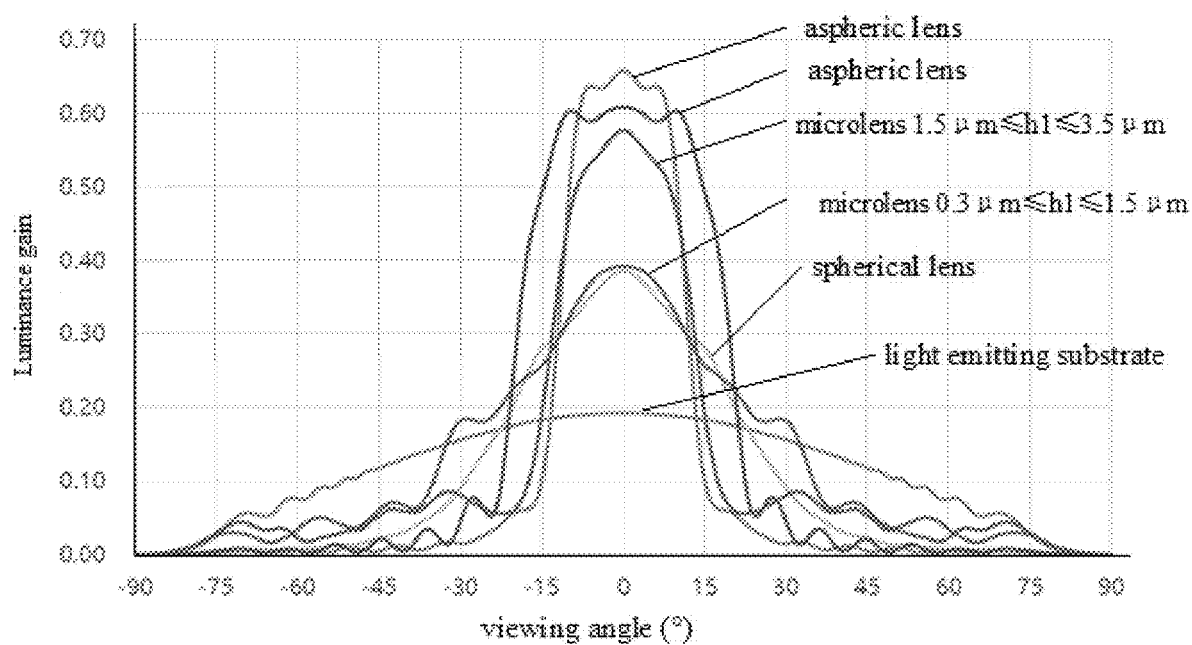
FIG. 7 schematically shows luminance gain distribution curves of several lenses under different viewing angles.

The inventors performed optical simulations on the luminance gains of the micro lenses and aspheric lenses at different viewing angles, and the simulation results are shown in FIG. 7. In FIG. 7, the light emitting substrate, the aspheric lens and the spherical lens are comparative examples, the micro lens is an experimental example, and h1 is the height of the pillars 131 in the micro lens.

It can be seen from FIG. 7 that the micro lens can achieve the same effect as the aspheric lens, that is, the luminance gain is enhanced within a small viewing angle range, and the luminance gain is greatly weakened when the viewing angle exceeds a certain viewing angle. The simulation result of the micro lens 1.5 µm≤h1≤3.5 µm in FIG. 7 show that when the viewing angle exceeds 15°, the luminance gain is greatly weakened. Comparing the simulation results of the light emitting substrate and the micro lens, it can be seen that the micro lens can deflect the large viewing angle light emitted by the light emitting substrate to a small viewing angle range.

Figure 8:
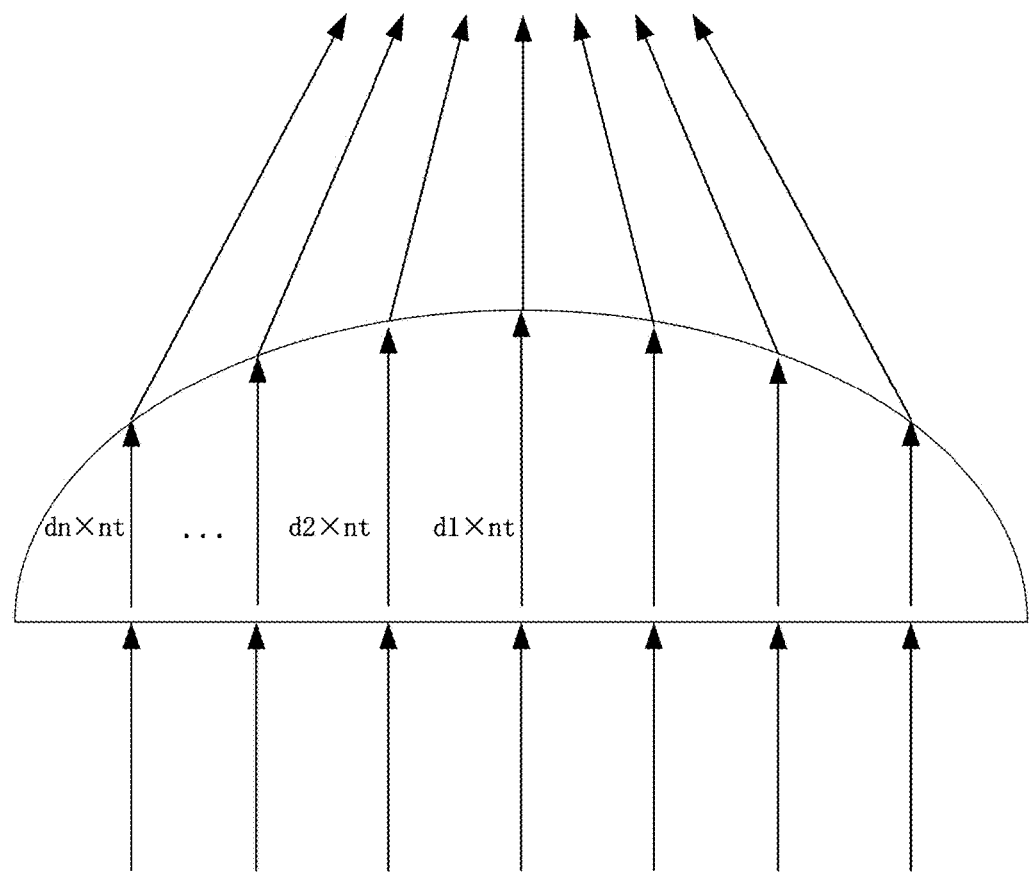
FIG. 8 schematically shows a schematic diagram of an optical path structure of an equivalent aspheric lens.

FIG. 8 schematically shows a schematic diagram of an optical path structure of an equivalent aspheric lens. Since the optical path length=n×d, and in the aspheric lens, the refractive index at different positions is nt, the optical path length can be changed by setting different lens heights at different positions. In the micro lens, the height of the micro lens is equal everywhere, so by setting the equivalent refractive index of the micro lens to decrease sequentially from the center of the light emitting region to the edge of the light emitting region, the change of the optical path length can also be realized. Therefore, the micro lens can be equivalent to an aspheric lens, which may converge the incident light.

In the present application, since the micro lens can be a planar structure with the same height everywhere, the simulation results shown in FIG. 7 correspond to the micro lens with height h1≤3500 nm, and the aspheric lens with a curved surface structure (its height ranges from 3000 nm to 6000 nm), compared with the aspherical lens, the use of micro lens structure can greatly reduce the vertical distance between the light emitting substrate 11 and the color conversion layer 15 or color filter layer 18, thereby further reducing the lateral propagation of outgoing light and further improving color crossing.

Figure 9:
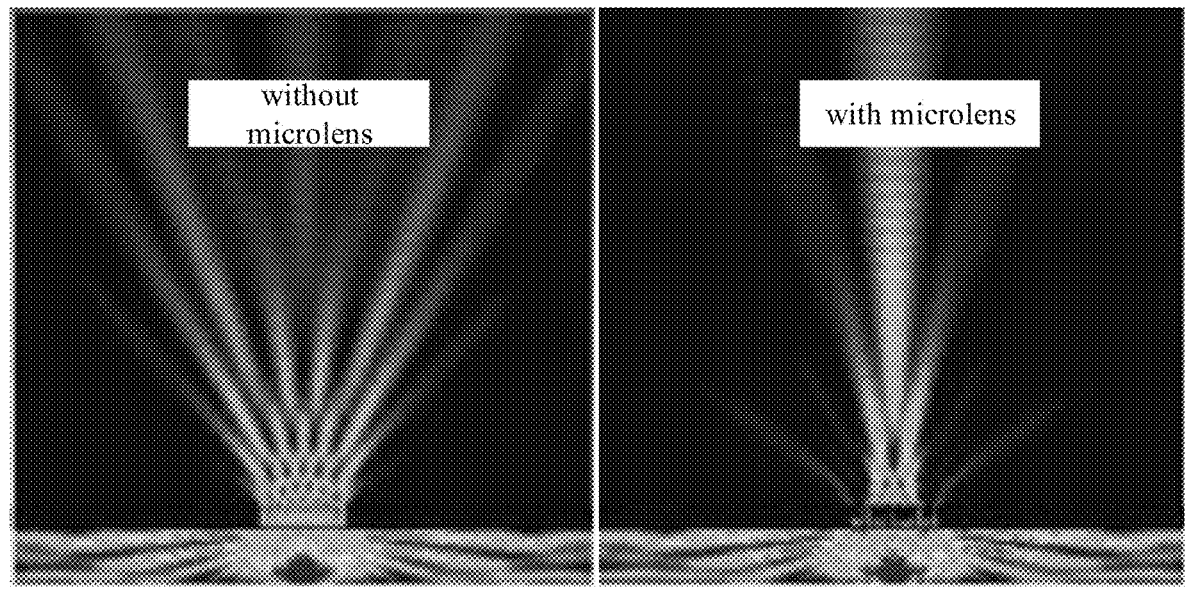
FIG. 9 schematically shows light beam simulation diagrams of two encapsulation layer structures.

FIG. 9 shows light beam simulation diagrams with and without micro lens in the encapsulation layer. The left figure in FIG. 9 is a light beam simulation diagram without micro lens in the encapsulation layer 12, and the right figure in FIG. 9 is a light beam simulation diagram with a micro lens in the encapsulation layer 12. By comparison, it is found that by arranging a micro lens in the encapsulation layer 12, the viewing angle range of light can be greatly reduced, and an obvious converging effect can be achieved.

In some implementations, the refractive index of the pillars 131 is greater than that of the first medium 132, and the volume ratio of the pillars 131 to the first medium 132 gradually decreases along the first direction.

According to the equivalent refractive index formula: n=n1×(V1/V)+n2×(V2/V), it can be seen that when the volume ratio V1/V2 of the pillars 131 to the first medium 132 gradually decreases along the first direction, the equivalent refractive index n of the first film layer 13 can gradually change from n1 to n2 along the first direction. Since the refractive index n1 of the pillars 131 is greater than the refractive index n2 of the first medium 132, the equivalent refractive index of the first film layer 13 can gradually decrease along the first direction.

In the case where the refractive index of the pillars 131 is greater than that of the first medium 132, as shown in FIG. 3, along the first direction (the direction from the center of the light emitting region to the edge of the light emitting region), the sizes of the pillars 131 may gradually decrease. In order to ensure that the volume ratio of the pillars 131 to the first medium 132 gradually decreases along the first direction, the center-to-center distance between two adjacent pillars 131 may remain unchanged, or gradually increase, etc. in the first direction.

In FIG. 3, each pillar 131 is a cylinder whose circular surface is parallel to the light emitting substrate, and of which the diameter gradually decreases along the first direction.

In the case that the refractive index of the pillars 131 is greater than the refractive index of the first medium 132, along the first direction, the sizes of the pillars 131 can also remain unchanged. In order to ensure that the volume ratio of the pillars 131 to the first medium 132 gradually decreases along the first direction, the center-to-center distance between two adjacent pillars 131 may gradually increase along the first direction, and so on.

In some implementations, the refractive index of the pillars 131 is smaller than that of the first medium 132, and the volume ratio of the pillars 131 to the first medium 132 gradually increases along the first direction.

According to the equivalent refractive index formula: n=n1×(V1/V)+n2×(V2/V), it can be seen that when the ratio V1/V2 between the volume V1 of the pillars 131 and the volume V2 of the first medium 132 gradually increases along the first direction, the equivalent refractive index n of the first film layer 13 can gradually change from n2 to n1 along the first direction. Since the refractive index n1 of the pillars 131 is less than the refractive index n2 of the first medium 132, the equivalent refractive index of the first film layer 13 can gradually decrease along the first direction.

In the case that the refractive index of the pillars 131 is less than that of the first medium 132, along the first direction, the sizes of the pillars 131 may gradually increase or remain unchanged. In order to ensure that the volume ratio of the pillars 131 to the first medium 132 gradually increases along the first direction, correspondingly, the center-to-center distance between two adjacent pillars 131 can remain unchanged or gradually decrease in the first direction.

In a specific implementation, the sizes and positions of the pillars 131 can be designed according to the distribution requirements of the refractive index. The change of the pillar size in the first direction, and the change of the distance between the centers of the pillars in the first direction are not limited to the above solutions, as long as it is ensured that when the refractive index of the pillars 131 is greater than the refractive index of the first medium 132, the volume ratio of the pillars 131 to the first medium 132 decreases gradually along the first direction, or when the refractive index of the pillars 131 is less than that of the first medium 132, the volume ratio of the pillars 131 to the first medium 132 gradually increases along the first direction.

In some embodiments, as shown in FIG. 3, the light emitting region has a first side s1 and a second side s2 that are adjacent, and the first side s1 is greater than or equal to the second side s2. Along the direction from the center of the light emitting region to the first side s1, the size attenuation rate of the pillars 131 is a first rate; along the direction from the center of the light emitting region to the second side s2, the size attenuation rate of the pillars 131 is a second rate.

Wherein, the first rate is greater than or equal to the second rate.

When the shape of the light emitting region is a circle, the first side s1 and the second side s2 can be two sides of the smallest circumscribed rectangle of the circle. In this case, the first side s1 is equal to the second side s2, and correspondingly, the first rate is equal to the second rate.

When the shape of the light emitting region is a rectangle, the first side s1 is the long side of the rectangle, and the second side s2 is the short side of the rectangle. In this case, the first side s1 is larger than the second side s2, and correspondingly, the first rate is greater than the second rate.

When the shape of the light emitting region is a square, the first side s1 and the second side s2 are two sides of the square. In this case, the first side s1 is equal to the second side s2, and correspondingly, the first speed equal to the second rate.

In some embodiments, the difference between the maximum value of the equivalent refractive index and the minimum value of the equivalent refractive index of the first film layer 13 is greater than or equal to 0.4, and less than or equal to 1.5. Further, the difference between the maximum value of the equivalent refractive index and the minimum value of the equivalent refractive index of the first film layer 13 may be greater than or equal to 0.4, and less than or equal to 0.9.

Wherein, the maximum value of the equivalent refractive index is the equivalent refractive index at a position in the first film layer 13 corresponding to the center of the light emitting region. The minimum value of the equivalent refractive index is the equivalent refractive index at a position in the first film layer 13 corresponding to the edge of the light emitting region.

In some embodiments, as shown in FIG. 3, the orthographic projections of the plurality of pillars 131 and the first medium 132 on the light emitting substrate 11 cover at least one light emitting region. That is, the orthographic projections of the plurality of pillars 131 and the first medium 132 on the light emitting substrate 11 cover one or more light emitting regions.

Further, as shown in FIG. 3, the orthographic projections of the plurality of pillars 131 and the first medium 132 on the light emitting substrate 11 also cover at least part of the non-light-emitting region. Specifically, it may include: the orthographic projections of a plurality of pillars 131 and the first medium 132 on the light emitting substrate 11 cover the edge region of the non-light-emitting region close to the light emitting region, or the orthographic projections of the plurality of pillars 131 and the first medium 132 on the light emitting substrate 11 cover the entire non-light-emitting region.

The light emitted from the light emitting region is incident on the first film layer 13, and the irradiation range on the first film layer 13 may be larger than the size of the light-emitting region. By setting the orthographic projections of a plurality of pillars 131 and the first medium 132 on the light emitting substrate 11 to cover at least part of the non-light-emitting region, the micro lens corresponding to the light emitting region can also converge the light beyond the light emitting region, so that more light converges into a small viewing angle range.

Figure 5:
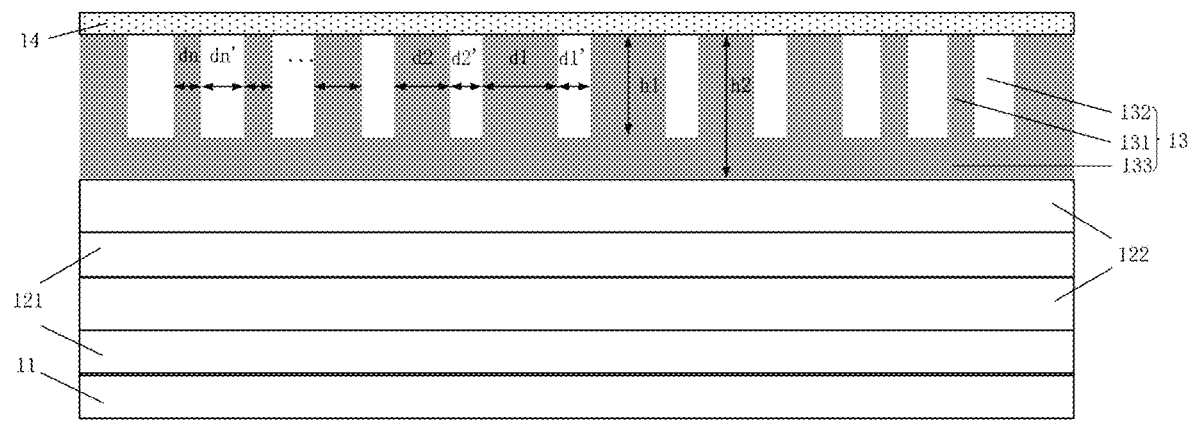
FIG. 5 schematically shows a schematic cross-sectional structure diagram of a light emitting substrate, an encapsulation layer and a leveling layer which are stacked.

In some examples, referring to FIG. 5, in the normal direction of the light emitting substrate 11, the thickness h1 of the pillars 131 is greater than or equal to 300 nm, and less than or equal to 4000 nm.

Optionally, the thickness h1 of the plurality of pillars 131 in the first film layer 13 may be equal.

Optionally, the thickness h1 of the pillars 131 is greater than or equal to 1500 mm, and less than or equal to 3500 nm. When the thickness h1 of the pillars 131 is within this range, the corresponding micro lens can converge more light into a small viewing angle range.

As shown in FIG. 7, comparing the simulation results of micro lenses with different thickness ranges of 1.5 $\mu m \leq h1 \leq 3.5$ $\mu m$ and 0.3 $\mu m \leq h1 \leq 1.5$ $\mu m$, it can be seen that the micro lens corresponding to 1.5 $\mu m \leq h1 \leq 3.5$ $\mu m$ has a stronger luminance gain in the small viewing angle range, and can converge light with a larger energy ratio into the small viewing angle range.

Optionally, the thickness h1 of the pillars 131 is greater than or equal to 300 nm, and less than or equal to 1500 nm. When the thickness h1 of the pillars 131 is within this range, the stress of the film layer can be reduced so as to avoid the warping of the film layer, and the material selection range of the first film layer 13 can be expanded. For example, materials with a higher refractive index such as silicon nitride can be selected.

In some embodiments, as shown in FIG. 5, the first film layer 13 may further include a film layer body 133 located on a side of the plurality of pillars 131 close to the light emitting substrate 11, and the film layer body 133 and the pillars 131 are integrally structured. Correspondingly, the thickness h1 of the pillars 131 is less than the thickness h2 of the first film layer 13.

In a specific implementation, an etching process may be used to form a plurality of pillars 131 on the first film layer 13. In the actual process, the etching depth can be controlled to ensure that the etching depth is less than the thickness h2 of the first film layer 13, so that other film layers can be prevented from affecting the equivalent refractive index, and it is helpful to obtain an equivalent refractive index that meets the expected design.

Exemplarily, the thickness h2 of the first film layer 13 is greater than or equal to 600 nm, and less than or equal to 2000 nm. Correspondingly, the thickness h1 of the pillars 131 may be greater than or equal to 300 mm, and less than or equal to 1500 nm.

It should be noted that the thickness h1 of the pillars 131 may also be equal to the thickness h2 of the first film layer 13, which is not limited in the present application.

In some embodiments, the first film layer 13 includes at least one of the following materials: silicon nitride, silicon oxide, silicon oxynitride, aluminum oxide, silicon carbon nitride, titanium oxide, zirconium oxide, parylene, and acrylic series organics and epoxy resin series organics.

Optionally, the first film layer 13 is made of inorganic materials, which can better prevent water and oxygen from invading the light emitting substrate.

Optionally, the first film layer 13 is made of inorganic materials such as silicon nitride, titanium oxide, and zirconium oxide, which can form pillars 131 with a relatively large refractive index.

Optionally, the first film layer 13 is made of organic materials such as acrylic and epoxy resin, which can form thicker pillars 131.

In some embodiments, as shown in FIG. 5, the encapsulation layer 12 further includes barrier layers 121 and spacer layers 122 stacked between the light emitting substrate 11 and the first film layer 13, and the barrier layer 121 is disposed close to the light emitting substrate 11.

Wherein, the function of the barrier layers 121 is to prevent water and oxygen from entering the light emitting substrate 11. The function of the spacer layers 122 is to improve the stress of the barrier layers 121 and to fill tiny defects of the barrier layers 121.

By arranging the barrier layers 121 and the spacer layers 122 on the side of the first film layer 13 close to the light emitting substrate 11, water and oxygen can be prevented from invading the light emitting substrate 11 through the gaps between the pillars, and water and oxygen can also be prevented from invading the light emitting substrate 11 during the process of preparing the pillars 131.

In a specific implementation, as shown in FIG. 5, the first film layer 13 can be arranged away from the light emitting substrate 11 in the encapsulation layer 12, that is, it is located on the top layer of the encapsulation layer 12. In this way, the light emitting substrate 11 can be protected to the greatest extent, and the influence of water and oxygen can be reduced.

In a specific implementation, the total number of film layers of the barrier layers 121 and the spacer layers 122 stacked between the light emitting substrate 11 and the first film layer 13 may be an even number or an odd number. Barrier layers 121 and spacer layers 122 may be arranged alternately, as shown in FIG. 5.

When the total number of film layers is an even number, one barrier layer 121 and one spacer layer 122 form a stacked unit. The first film layer 13 is disposed on a side of one or more stacked units away from the light emitting substrate 11.

According to the requirements of different products, a single stacking unit can be selected, for example, using a layer of silicon oxynitride as the barrier layer 121 and using a layer of acrylic series organics as the spacer layer 122. Or, multiple stacked units are used. For example, using silicon nitride as the barrier layers 121 and using silicon carbon nitride as the spacer layers 122, 2 to 8 stacked units composed of silicon nitride and silicon carbon nitrogen can be stacked between the light emitting substrate 11 and the first film layer 13.

In some embodiments, the barrier layer 121 and the spacer layer 122 each independently include at least one of the following materials: silicon nitride, silicon oxide, silicon oxynitride, aluminum oxide, silicon carbon nitride, titanium oxide, zirconium oxide, poly Toluene, acrylic series organics and epoxy resin series organics.

In a specific implementation, the inorganic material in the encapsulation layer 12 can be formed by a chemical vapor deposition process, and the organic material can be formed by an inkjet printing process.

In some embodiments, as shown in FIG. 1 or FIG. 2, the light emitting panel further includes a leveling layer 14 disposed on a side of the first film layer 13 away from the light emitting substrate 11. Correspondingly, the first medium 132 includes a gas and/or a material of the leveling layer 14 filled in the gaps between the pillars.

Optionally, the refractive index of the leveling layer 14 may be greater than 1.0, and less than or equal to the refractive index of the pillars 131.

Figure 6:
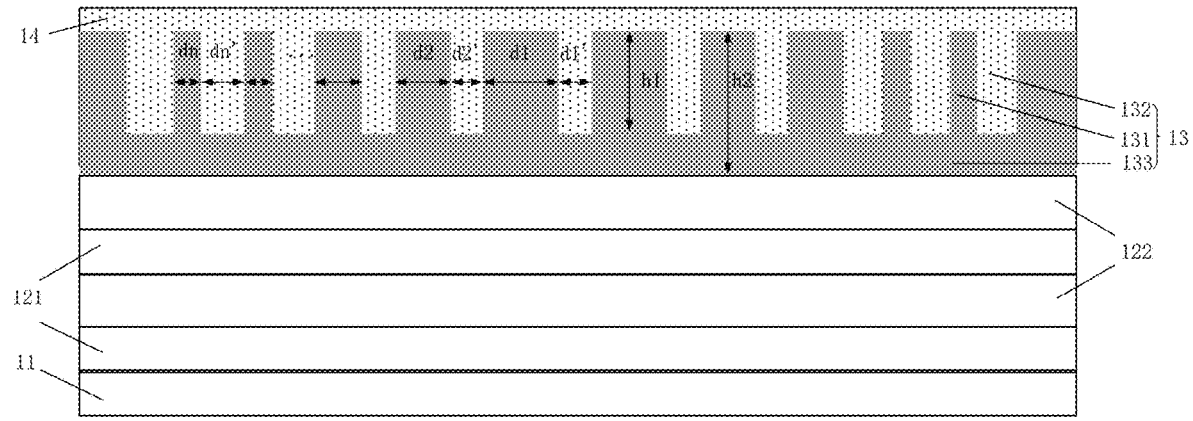
FIG. 6 schematically shows another cross-sectional schematic diagram of a light emitting substrate, an encapsulation layer and a leveling layer which are stacked.

If the viscosity of the material of the leveling layer 14 is low (e.g., <300 cps), the material of the leveling layer 14 can flow into the gaps of the pillars. In the case that the material of the leveling layer 14 completely fills the gaps between the pillars, as shown in FIG. 6, the first medium 132 is the material of the leveling layer 14; in the case where the material of the leveling layer 14 partially fills the gaps between the pillars, the first medium 132 includes filling gas and material of leveling layer 14.

When the material of the leveling layer 14 completely fills the gaps between the pillars, the adhesion between the first film layer 13 and the leveling layer 14 can be improved due to the increased contact area.

It should be noted that when the first medium 132 includes the filling gas and the material of the leveling layer 14, it is necessary to consider the refractive index of the pillars, the volume of the pillars, the refractive index of the filling gas, the volume occupied by the filling gas, the refractive index of the material of the leveling layer 14 and the volume occupied by the material of the leveling layer 14 when calculating the equivalent refractive index.

If the viscosity of the material of the leveling layer 14 is relatively high (e.g., >5000 cps), the material of the leveling layer 14 cannot flow into the gaps between the pillars, as shown in FIG. 5. In this case, the first medium 132 includes a filling gas.

Wherein, the filling gas may include air, nitrogen, argon, helium and other gases filled in the gaps between the pillars.

In some embodiments, the refractive index of the pillars 131 is greater than or equal to 1.5, and less than or equal to 2.5; the refractive index of the first medium 132 is greater than or equal to 1.0, and less than or equal to 1.5.

For example, the pillars 131 can be made of silicon nitride, with a refractive index $n1=1.9$, and the first medium 132 can be air filled in the gaps between the pillars, with a refractive index $n2=1.0$.

In some embodiments, referring to FIG. 5, in a direction parallel to the plane where the light emitting substrate 11 is located, the sizes di of the pillars 131 are greater than or equal to 60 nm and less than or equal to 400 nm, wherein $di=d1, d2, \ldots$ or $dn$.

In some embodiments, the minimum distance di' between two adjacent pillars 131 is greater than or equal to 20 mm and less than or equal to 400 nm, wherein $di'=d1', d2', \ldots$ or $dn'$.

In some embodiments, the shape of the orthographic projections of the pillars 131 on the light emitting substrate 11 may include at least one of the following regular and irregular shapes: polygons, circles, ellipses, sectors and the like.

The pillar 131 may include a bottom surface close to the light emitting substrate 11 and a top surface far away from the light emitting substrate 11. Wherein, the orthographic projections of the bottom surface and the top surface on the light emitting substrate 11 can completely overlap; or, the orthographic projection of the top surface on the light emitting substrate 11 is within the range of the orthographic projection of the bottom surface on the light emitting substrate 11; and so on.

In some embodiments, the viewing angle range of the light emitting panel is smaller than the viewing angle range of the light emitting substrate 11.

Optionally, the viewing angle range of the light emitting panel is less than or equal to 30°. Further, the viewing angle range of the light emitting panel may be less than or equal to 15°

In some embodiments, as shown in FIG. 1 or FIG. 2, the light emitting substrate 11 includes a first substrate baseplate 16, a plurality of switching elements T disposed on the first substrate baseplate 16, and a plurality of light emitting devices 17 connected to the switching elements T. Wherein, the light emitting devices 17 are located in the light emitting region, and the encapsulation layer 12 is located on the light exiting side of the light emitting devices.

Optionally, the light emitting device 17 is an organic light emitting diode (OLED), or a quantum dot light emitting diode (QLED).

In some embodiments, as shown in FIG. 1 or FIG. 2, the above-mentioned light emitting panel may further include a color conversion layer 15 disposed on the light exiting side of the encapsulation layer 12, for receiving incident light and emitting light that is different in color from the incident light. The incident light is the light emitted by the light emitting devices.

When the light emitting panel includes the above-mentioned leveling layer 14 and color conversion layer 15, the color conversion layer 15 is located on a side of the leveling layer 14 away from the light emitting substrate 11, as shown in FIG. 1 or FIG. 2.

Figure 11:
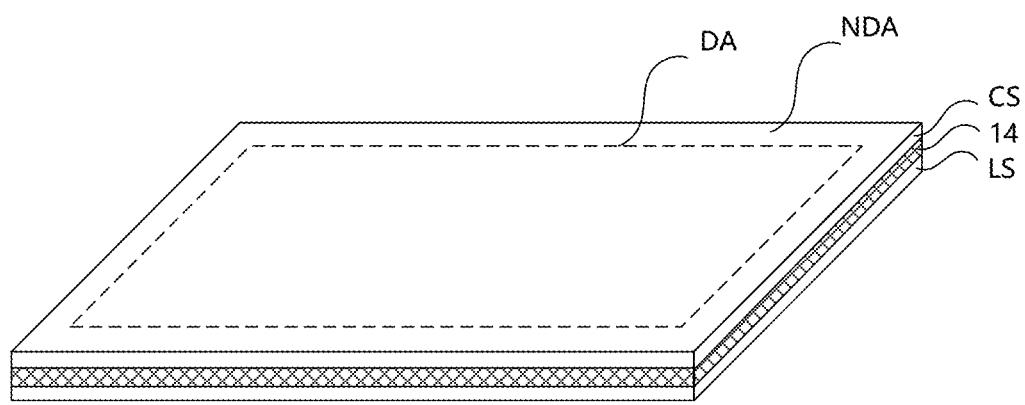
FIG. 11 schematically shows a schematic plan structure diagram of a light emitting panel provided by the present application.

Optionally, as shown in FIG. 11, the light emitting panel includes an effective light emitting region DA and a frame region NDA located on at least one side of the effective light emitting region. The effective light emitting region DA may include a plurality of pixels.

FIG. 1 or FIG. 2 shows a schematic cross-sectional structure diagram of a pixel in the effective light emitting region DA. As shown in FIG. 1 or FIG. 2, each pixel includes a red sub-pixel R, a blue sub-pixel B and a green sub-pixel G.

As shown in FIG. 1 or FIG. 2, the plurality of light emitting devices 17 may include a first light emitting device LD1 in the red sub-pixel R, a second light emitting device LD2 in the green sub-pixel G, and a third light emitting device in the blue sub-pixel B. Device LD3. The sub-pixels and the light emitting devices 17 may be provided in one-to-one correspondence.

Optionally, the incident light includes blue light.

Optionally, as shown in FIG. 1 or FIG. 2, the color conversion layer 15 may include a first color conversion pattern CCP1 in the red sub-pixel R for emitting red light when excited by incident light.

Wherein, the orthographic projection of the first color conversion pattern CCP1 on the first substrate baseplate 16 may cover the orthographic projection of the light emitting region of the first light emitting device LD1 on the first substrate baseplate 16.

Optionally, as shown in FIG. 1 or FIG. 2, the color conversion layer 15 may further include a second color conversion pattern CCP2 in the green sub-pixel G for emitting green light when excited by incident light.

Wherein, the orthographic projection of the second color conversion pattern CCP2 on the first substrate baseplate 16 may cover the orthographic projection of the light emitting region of the second light emitting device LD2 on the first substrate baseplate 16.

Optionally, as shown in FIG. 1 or FIG. 2, the color conversion layer 15 may further include a transmissive pattern TP in the blue sub-pixel B for transmitting incident light.

Wherein, the orthographic projection of the transmissive pattern TP on the first substrate baseplate 16 may cover the orthographic projection of the light emitting region of the third light emitting device LD3 on the first substrate baseplate 16.

Exemplarily, as shown in FIG. 1 or FIG. 2, the color conversion layer 15 includes partition walls PW, and a plurality of color conversion patterns located in a plurality of openings defined by the partition walls PW. The plurality of color conversion patterns may include the first color conversion pattern CCP1, the second color conversion pattern CCP2, and the transmissive pattern TP.

Figure 12:
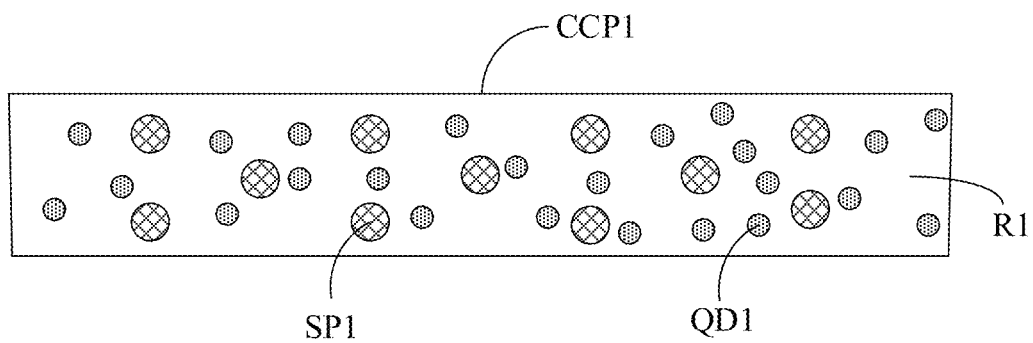
FIG. 12 schematically shows a schematic cross-sectional structure diagram of an example of a first color conversion pattern.

The first color conversion pattern CCP1 may emit light by converting or shifting a peak wavelength of incident light to another specific peak wavelength. The first color conversion pattern CCP1 may convert emission light provided from the first light emitting device LD1 into red light having a peak wavelength in a range of about 610 mm to about 650 nm. Referring to FIG. 12, the first color conversion pattern CCP1 may include a first base resin R1 and a first color conversion material QD1 dispersed in the first base resin R1, and may include first scattering particles SP1 dispersed in the first base resin R1.

Figure 13:
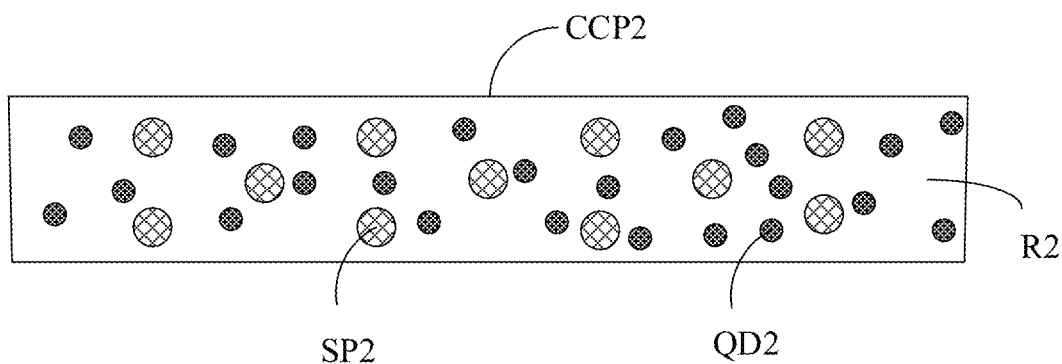
FIG. 13 schematically shows a schematic cross-sectional structure diagram of an example of a second color conversion pattern.

The second color conversion pattern CCP2 may emit light by converting or shifting a peak wavelength of incident light to another specific peak wavelength. The second color conversion pattern CCP2 may convert emission light provided from the second light emitting device LD2 into green light having a peak wavelength in a range of about 510 nm to about 550 nm. Referring to FIG. 13, the second color conversion pattern CCP2 may include a second base resin R2 and a second color conversion material QD2 dispersed in the second base resin R2, and may include second scattering particles SP2 dispersed in the second base resin R2.

Figure 14:
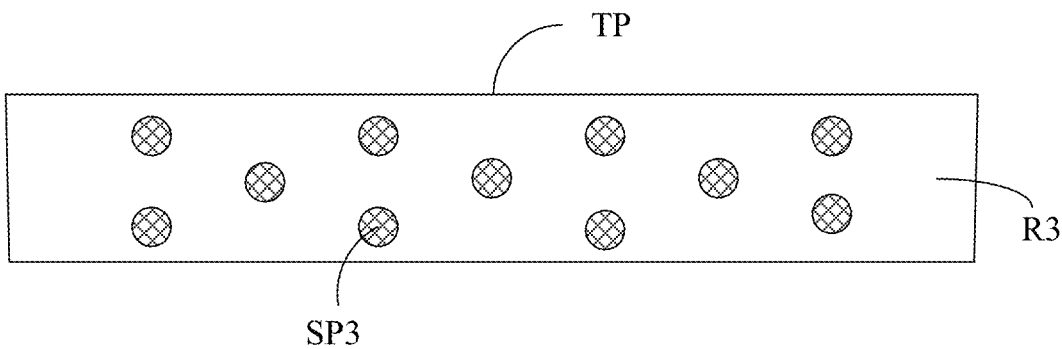
FIG. 14 schematically shows a schematic cross-sectional structure diagram of an example of a transmissive pattern.

The transmissive pattern TP can transmit the incident light, and for example, has a transmittance of over 90% for the peak wavelength of the incident light. The transmissive pattern TP may transmit emitted light provided from the third light emitting device LD3. Referring to FIG. 14, the transmissive pattern TP may include a third base resin R3 and third scattering particles SP3 dispersed in the third base resin R3. The provision of the third scattering particles SP3 can expand the viewing angle range of the incident light, increase the light extraction of blue light, and improve the viewing angle uniformity among the red sub-pixel R, the green sub-pixel G and the blue sub-pixel B.

Wherein, the first color conversion material QD1 and the second color conversion material QD2 may include semiconductor nano-crystal materials, which can emit light of a specific color when electrons transition from the conduction band T to the valence band. Quantum dots can have any shape as long as the shape is commonly used in the art, and specifically can be spherical, conical, multi-armed or cubic nanoparticles, or may be nanotubes, nanowires, nanofibers or nano particles etc.

In some embodiments, a quantum dot may have a core-shell structure that includes a core material and a shell material: the core-shell structure includes a nanocrystalline core and a shell surrounding the core. The shell of the quantum dot can serve as a protective layer for preventing chemical modification of the core and maintaining semiconducting properties and/or a charging layer for imparting electrophoretic properties to the quantum dot. The shell may have a single-layer structure or a multi-layer structure. The interface between the core and the shell may have a concentration gradient in which the concentration of elements in the shell decreases towards the center of the core. The core of the quantum dot can be selected from the group consisting of: Group II-VI compounds, Group III-V compounds, Group IV-VI compounds, Group IV elements, Group IV compounds, and combinations thereof. The shell of the quantum dot may include an oxide of a metal or non-metal material, a semiconductor compound, or a combination thereof. A transition material can be added between the core material and the shell material to realize the gradual transition of the lattice, effectively reducing the internal pressure caused by the lattice defect of the quantum dot, thereby further improving the luminous efficiency and stability of the quantum dot.

In some embodiments, the Group II-VI compounds may be selected from the group consisting of: CdSe, CdTe, ZnS, ZnSe, ZnTe, ZaO, HgS, HeSe, HgTe, MgSe, MgS and selected from the group of binary compounds formed by mixtures thereof; AgInS, CuInS, CdSeS, CdSeTe, CdSTe, ZnSeS, ZnSeTe, ZnSTe, HoSeS, HgSeTe, HgSTe, CdZnS, CdZnSe, CdZnTe, CdHgS, CdHgSe, CdHgTe, HgZnS, HgZnSe, HaZnTe, MgZnSe, MgZnS and selected from the group of ternary compounds formed by mixtures thereof; and HgZnTeS, CdZnSeS, CdZnSeTe, CdZnSTe, CdHgSeS, CdHgSeTe, CdHgSTe, HgZnSeS, HgZnSeTe, HgZnSTe and selected from the group of quaternary compounds formed by mixtures thereof.

In some embodiments, the Group III-V compounds may be selected from the group consisting of: GaN, GaP, GaAs, GaSb, AlN, AlP, AlAs, AlSb, InN, InP, InAs, InSb, and selected from the group of binary compounds formed by mixtures thereof; GaNP, GaNAs, GaNSb, GaPAs, GaPSb, AlNP, AlNAs, AlNSb, AlPAS, AlPSb, InGaP, InNAs, InNP, InNAs, InNSb, InPAs, InPSb and selected from the group of ternary compounds formed by mixtures thereof; and GaAlNP. GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and selected from the group of quaternary compounds formed by mixtures thereof.

In some embodiments, the Group III-V compounds may be selected from the group consisting of: GaN, GaP, GaAs, GaSb, AlN, AlP, AlAs, AlSb, InN, InP, InAs, InSb, and selected from the group of binary compounds formed by mixtures thereof; GaNP, GaNAs, GaNSb, GaPAs, GaPSb, AlNP, AlNAs, AlNSb, AlPAs, AlPSb, InGaP, InNAs, InNP, InNAs, InNSb, InPAs, InPSb and selected from the group of ternary compounds formed by mixtures thereof; and GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and selected from the group of quaternary compounds formed by mixtures thereof.

In some embodiments, the transition material may be a ternary alloy material. By controlling the optical properties of quantum dots through ternary alloy materials, it is possible to form quantum dots with uniform volume but different light emitting frequencies, thereby improving the color gamut coverage of display devices.

In some embodiments, the core material of the quantum dot includes CdSe and/or InP, and the shell material includes ZnS. Take the core material including InP as an example, the surface defects of InP quantum dot form surface trap states. By coating the surface of InP quantum dot with ZnS, a core-shell structure with InP as the core material and ZnS as the shell material is formed to reduce the surface defects of the quantum dot and optimize the luminous efficiency and stability of the quantum dot. The above is just an example where the core material includes InP. In the case where the core material includes CdSe, or the core material includes CdSe and InP, the above rules are also met.

In some embodiments, the quantum dot QD does not include cadmium (Cd). For example, the core material of the QD is InP, and the shell material is a stack of ZnSe/ZnS; or, for example, the core material of the QD is ZnTeSe, and the shell material is ZnSe/ZnS.

The quantum dot can have a size less than 45 nanometers (nm), e.g., 40 nm, 30 nm, 20 mm or less. In some embodiments, the size of the quantum dot is 4 nm~20 nm, for example, it can be 4 nm, 5 nm, 7 nm, 10 nm, 13 nm, 17 nm or 20 nm. Quantum dots can adjust the color of emitted light according to their sizes, and thus quantum dots can emit light of various colors, such as blue light, red light, green light, and the like. Wherein, the sizes of the red quantum dots and the sizes of the green quantum dots may be different.

Wherein, the first color conversion material QD1 and the second color conversion material QD2 are not limited to the above-mentioned materials of quantum dots, the first color conversion material QD1 and the second color conversion material QD2 can also independently select one or more color conversion materials such as quantum dots, rare earth materials, fluorescent materials, organic dyes, and the like.

As a new type of luminescent material, quantum dot materials have the advantages of concentrated luminescence spectrum, high color gamut, high color purity, easy adjustment of luminescent color through the size, structure or composition of quantum dot materials, and the like. In practical applications, the quantum dot inks are sequentially solution processed, spin-coated or inkjet, and then further cured to form a film to form a quantum dot film layer, which can be used as a luminescent material for solid-state lighting and flat panel display.

When the light emitting device 17 is an OLED, and the color conversion layer 15 is made of quantum dot material, the combination of the pixel-level control of the OLED and the color enhancement characteristics of quantum dots can be realized to obtain better display characteristics, while reducing power consumption and prolonging the service life of the light emitting panel. In addition, in the process of manufacturing multiple light emitting devices 17, the light emitting layer located in different sub-pixels can be formed on the entire surface. For example, an open mask can be used to simultaneously form the light emitting layer located in different sub-pixels, thereby simplifying the manufacturing process.

Optionally, as shown in FIG. 1 or FIG. 2, the above-mentioned light emitting device further includes a color filter layer 18 disposed on the light exiting side of the color conversion layer 15.

Optionally, as shown in FIG. 1 or FIG. 2, the color filter layer 18 includes a first color filter pattern CF1 in the red sub-pixel R for transmitting red light incident on the first color filter pattern CF1.

Optionally, as shown in FIG. 1 or FIG. 2, the color filter layer 18 includes a second color filter pattern CF2 in the green sub-pixel G for transmitting the green light incident on the second color filter pattern CF2.

Optionally, as shown in FIG. 1 or FIG. 2, the color filter layer 18 includes a third color filter pattern CF3 in the blue sub-pixel B for transmitting the blue light incident to the third color filter pattern CF3.

Optionally, as shown in FIG. 2, the above light emitting panel further includes a second substrate baseplate 19 disposed on a side of the color filter layer 18 away from the color conversion layer 15.

As shown in FIG. 2, the leveling layer 14 disposed on the side of the encapsulation layer 12 away from the light emitting substrate 11 is located between the encapsulation layer 12 and the color conversion layer 15 for bonding the encapsulation layer 12 and the color conversion layer 15.

Figure 10:
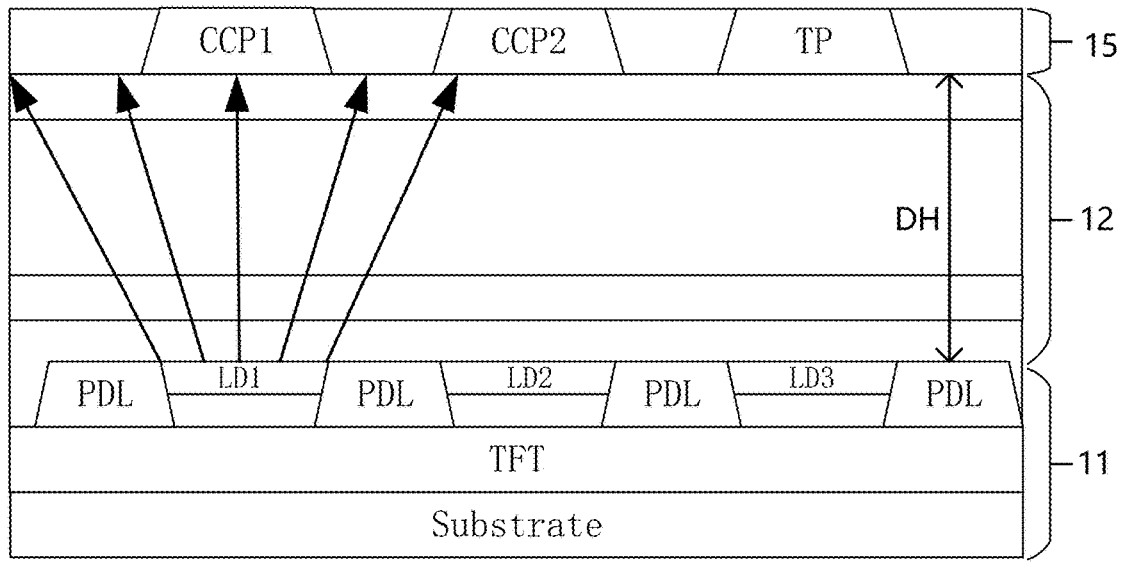
FIG. 10 schematically shows a schematic diagram of a propagation path of light between the light emitting substrate and a color conversion layer.

As shown in FIG. 10, in the case that the vertical distance DH between the light emitting substrate 11 and the color conversion layer 15 is large, when a sub-pixel needs to be lit, for example, when the red sub-pixel is lit, the light emitted by the first light emitting device LD1, in addition to vertically traveling to the first color conversion pattern CCP1 in the red sub-pixel, will travel laterally to the second color conversion pattern CCP2 in the green sub-pixel or the transmissive pattern TP in the blue sub-pixel, resulting that in red light A certain amount of green light or blue light is mixed, causing red light to mix a certain amount of green or blue light, which causes color crossover between pixels and a decrease in color gamut. The larger the value of the vertical distance DH is, the longer the light emitted by the light emitting substrate 11 travels in the lateral direction, and the more serious the color cross-color problem is.

In order to avoid the occurrence of cross-color problems, in some embodiments, the thickness of the encapsulation layer 12 is less than or equal to 4000 nm in the normal direction of the light emitting substrate 11.

By reducing the thickness of the encapsulation layer 12, the vertical distance between the light emitting substrate 11 and the color conversion layer 15 can be reduced, thereby reducing the lateral traveling distance of the light emitted by the light emitting substrate 11, further reducing the occurrence of cross-color problems.

In order to achieve a thinner encapsulation layer 12, the barrier layer 121 and the spacer layer 122 can be selected from materials that can be formed by means of chemical vapor deposition. For example, the barrier layer 121 can be selected from at least one of the following inorganic materials such as silicon nitride, silicon oxynitride, aluminum oxide, and the like. The spacer layer 122 can be selected from at least one of the following materials: silicon carbon nitride, silicon oxynitride, aluminum oxide, silicon oxide, parylene, and like.

Exemplarily, the barrier layer 121 can be made of silicon nitride, and the spacer layer 122 can be made of silicon carbon nitride. The barrier layer 121 may have a thickness of 0.3 μm~0.8 μm, and the spacer layer 122 may have a thickness of 0.3 μm~1.5 μm. The total number of film layers of the barrier layer 121 and the spacer layer 122 can be set to 2-8 layers. Wherein, the total number of film layers may be an odd number, for example, a silicon nitride-silicon carbon nitride-silicon nitride three-layer structure is formed, and the first film layer 13 is located on the side of the three-layer structure away from the light emitting substrate 11; the total number of film layers is also be an even number, for example, a silicon nitride-silicon carbon nitride-silicon nitride-silicon carbon nitride four-layer structure is formed, and the first film layer 13 is located on the side of the four-layer structure away from the light emitting substrate 11.

In some embodiments, the light emitting panel provided in the present application may be a lighting panel. In this case, the light emitting panel serves as a light source to realize the lighting function. For example, the light emitting panel can be a backlight module in a liquid crystal display device, a lamp for internal or external lighting, or various signal lamps, etc.

In some other embodiments, the light emitting panel provided in the present application may be a display panel. In this case, the light emitting panel has the function of displaying images (i.e., pictures).

It should be noted that in the actual process, due to the limitation of process conditions or other factors, the sameness of the above-mentioned features cannot be completely the same, and there may be some deviations. Therefore, as long as the same relationship among the above-mentioned features roughly meets the above-mentioned conditions, they all belong to the protection scope of the present application. For example, the above-mentioned sameness may be the sameness allowed within the error tolerance range.

The present application also provides a light emitting apparatus, including: the light emitting panel provided in any one of the embodiments; a driving integrated circuit configured to provide a driving signal to the light emitting panel; and a power supply circuit configured to provide power to the light emitting panel.

Those skilled in the art can understand that the light emitting apparatus has the above advantages of the front light emitting panel.

Wherein, the light emitting apparatus may be a display or a product including a display. Wherein, the display may be a flat panel display (FPD), a micro display, and the like. If divided according to whether the user can see the scene on the back of the display, the display can be a transparent display or an opaque display. If divided according to whether the display can be bent or rolled, the display may be a flexible display or a common display (which may be called a rigid display). Exemplarily, products containing displays may include: computers, televisions, billboards, laser printers with display functions, telephones, mobile phones, electronic paper, personal digital assistants (PDA), laptop computers, digital cameras, tablet, laptop, navigator, camcorder, viewfinder, vehicle, large walls, theater screens or stadium signage, etc.

The present application also provides a method for manufacturing a light emitting panel. Referring to FIG. 1 or FIG. 2, the manufacturing method includes:

Step S01: providing a light emitting substrate 11 including at least one light emitting region and a non-light-emitting region surrounding the light emitting region;

Step S02: forming an encapsulation layer 12 on a light exiting side of the light emitting substrate 11, wherein the encapsulation layer 12 includes a first film layer 13 including a plurality of pillars 131 spaced apart from each other and a first medium 132 disposed gaps between the pillars; the refractive index of the pillars 131 is different from that of the first medium 132, and the volume ratio between the pillars 131 and the first medium 132 gradually increases or decreases along a first direction, so that the equivalent refractive index of the first film layer 13 gradually decreases along the first direction which is a direction from the center of the light emitting region to the edge of the light emitting region.

The light emitting panel provided by any of the above embodiments can be prepared by using the manufacturing method provided in the present application.

In some examples, referring to FIG. 15A to FIG. 15F, step S02 may specifically include the following steps.

Figure 15A:
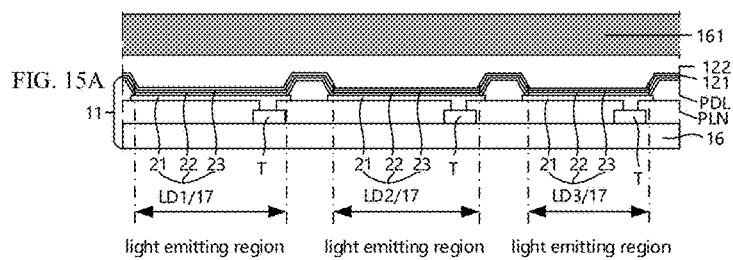
FIG. 15A to FIG. 15F schematically show flow charts of a method for manufacturing a light emitting panel provided by the present application.

Step S11: forming an encapsulation material layer 161 on the light exiting side of the light emitting substrate 11, wherein the orthographic projection of the encapsulation material layer 161 on the light emitting substrate 11 covers the light emitting substrate 11, as shown in FIG. 15A.

Figure 15B:
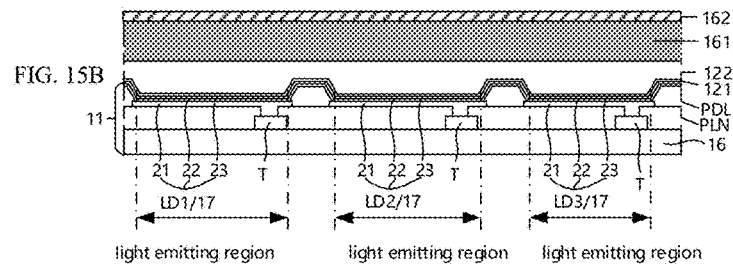

Step S12: forming a metal layer 162 on the side of the encapsulation material layer 161 away from the light emitting substrate 11, wherein the orthographic projection of the metal layer 162 on the light emitting substrate 11 covers the light emitting substrate 11, as shown in FIG. 15B.

Wherein, the metal layer 162 may include metal materials such as aluminum, molybdenum, titanium/aluminum/titanium, and the like.

Figure 15C:
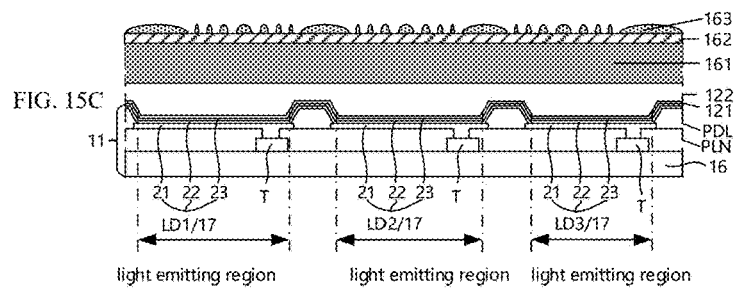

Step S13: using a nanoimprint process to form a protective adhesive layer 163 by patterning on the side of the metal layer 162 away from the light emitting substrate 11, as shown in FIG. 15C.

Figure 15D:
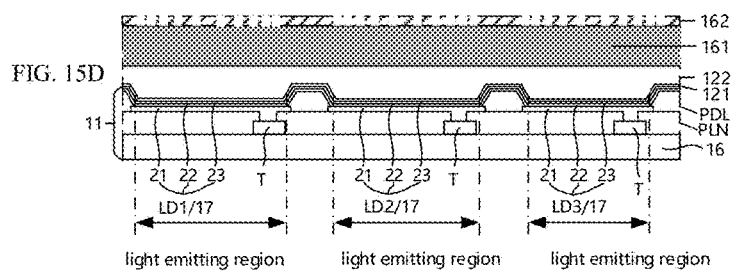

Step S14: etching the metal layer 162 by using the protective adhesive layer 163 as a mask, to obtain a patterned metal layer 162, as shown in FIG. 15D.

After the patterned metal layer 162 is obtained, the etching residual protective adhesive layer 163 can be peeled off.

Figure 15E:
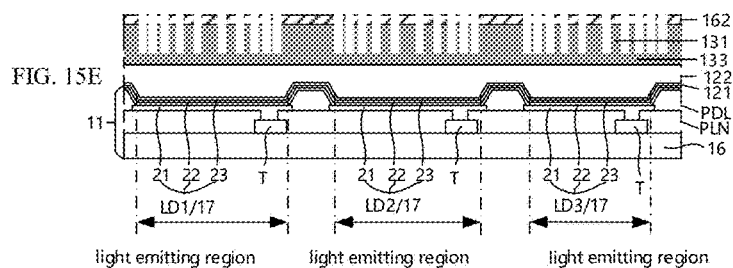

Step S15: etching the encapsulation material layer 161 by using the patterned metal layer 162 as a mask, to form a plurality of pillars 131 and the film layer body 133, as shown in FIG. 15E.

Figure 15F:
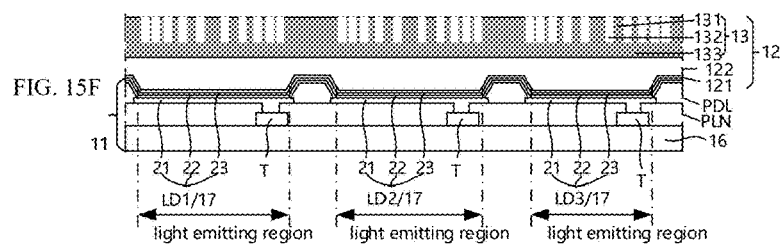

Step S16: removing the patterned metal layer 162 to form the first film layer 13, as shown in FIG. 15F. Wherein, the first film layer 13 includes a plurality of pillars 131 and a first medium 132 filled in the gaps between the pillars.

In step S16, a process that can etch the material of the metal layer 162 without damaging the material of the first film layer 13 can be selected to remove the patterned metal layer 162 and only keep the pillars 131.

In some embodiments, the manufacturing method of the light emitting panel shown in FIG. 1 may include the following steps.

Step S21: forming a plurality of switching elements T on the first substrate baseplate 16, then forming a flat layer PLN on the side of the plurality of switching elements T away from the first substrate baseplate 16, then forming a first electrode 21 layer on the side of the flat layer PLN away from the first substrate baseplate 16, and then forming a pixel definition layer PDL on the side of the first electrode 21 layer away from the first substrate baseplate 16, wherein the pixel definition layer PDL is used to define and form a plurality of pixel openings.

Wherein, the first electrode 21 layer includes a plurality of first electrodes 21 corresponding to the pixel openings one by one, and the orthographic projections of the first electrodes 21 on the first substrate baseplate 16 cover the orthographic projections of the pixel openings at the corresponding positions on the first substrate baseplate 16. The switching elements T such as thin film transistors are connected to the first electrodes 21 through a via hole provided on the flat layer PLN.

The first substrate baseplate 16 may be a flexible substrate made of such as polyimide or polyethylene terephthalate; or may be a rigid substrate made of such as glass or silicon chip.

Step S22: using an evaporation process, sequentially forming a light emitting functional layer 22 and a second electrode layer 23 on the side of the first electrodes 21 and the pixel definition layer PDL away from the first substrate baseplate 16. Wherein, the light emitting functional layer 22 may include one or more of an electron transport layer, an electron blocking layer, a hole transport layer, a hole blocking layer, an electron injection layer, a hole injection layer, a light emitting layer, and the like. The second electrode layer 23 may include metal materials such as magnesium and silver, or metal oxide materials such as indium zinc oxide. The second electrode layer 23 is a transparent or semitransparent electrode layer. The first electrode 21, the light emitting functional layer 22 and the second electrode layer 23 constitute the light emitting device 17.

Step S23: sequentially forming a barrier layer 121, a spacer layer 122 and a first film layer 13 on the side of the second electrode layer 23 away from the first substrate baseplate 16 to obtain the encapsulation layer 12. The first film layer 13 includes a plurality of pillars 131 and a first medium 132 filling gaps between the pillars 131.

Step S24: forming a leveling layer 14 on the entire surface of the encapsulation layer 12 away from the first substrate baseplate 16.

Step S25: sequentially forming partition walls PW and a plurality of color conversion patterns in the plurality of openings defined by the partition walls PW on the side of the leveling layer 14 away from the first substrate baseplate 16, to obtain a color conversion layer 15.

Step S26: forming a quantum dot protection layer 110 on the side of the color conversion layer 15 away from the first substrate baseplate 16 to prevent water and oxygen from corroding the materials in the color conversion layer 15.

Step S27: sequentially forming black matrices BM and a plurality of color filter patterns in a plurality of openings defined by the black matrices BM on the side of the quantum dot protective layer 110 away from the first substrate baseplate 16, to obtain a color filter layer 18.

Step S28: using optical cement 10 to attach a cover protection layer 101 to the side of the color filter layer 18 away from the first substrate baseplate 16, to obtain the light emitting panel as shown in FIG. 1. The cover protection layer 101 can be rigid glass, or a flexible film such as polyimide or polyethylene terephthalate.

In some other embodiments, referring to FIG. 2, the plurality of switching elements T, the flat layer PLN, first electrodes 21, the pixel definition layer PDL, the light emitting functional layer 22, the second electrode layer 23 and the encapsulation layer 12 may also be sequentially formed on the first substrate baseplate 16 to obtain the substrate LS in the light emitting panel as shown in FIG. 2; the color filter layer 18, the color conversion layer 15 and the quantum dot protective layer are sequentially formed on the second substrate baseplate 19 to obtain the substrate CS in the light-emitting panel as shown in FIG. 2; afterwards, the substrate LS and the substrate CS can be bonded together with a filling glue, and the leveling layer 14 formed by the filling glue is located between the encapsulation layer 12 and the quantum point protection layer, thereby obtaining the light emitting panel as shown in FIG. 2.

In this embodiment, in order to facilitate subsequent box alignment with the second substrate baseplate 19, the first substrate baseplate 16 may be a rigid substrate made of such as glass or a silicon wafer.

Embodiments in this specification are described in a progressive manner, wherein each embodiment focuses on the difference from other embodiments, and the same and similar parts among each embodiment can be referred to each other.

Finally, it should also be noted that in the specification, relational terms such as the first and second are only used to distinguish one entity or operation from another entity or operation, and do not necessarily require or imply any such actual relationship or order between these entities or operations. Moreover, the terms "including", "comprising" or any other variation thereof are intended to cover non-exclusive inclusion, so that a process, method, commodity or equipment that includes a series of elements not only includes those elements, but also includes other elements that are not explicitly listed, or also includes elements inherent in such process, method, commodity or equipment. In the absence of further restrictions, the elements defined by the statement "including a . . . " do not exclude the existence of other identical elements in the process, method, commodity or equipment including the said elements.

The above describes a light-emitting panel, its preparation method and light-emitting device provided by the present application in detail, and describes the principle and implementation of the present application with specific examples. The description of the above embodiments is only used to help understand the method and core idea of the present application; At the same time, for those skilled in the art, according to the idea of the present application, there will be changes in the specific implementation mode and application scope. To sum up, the content of this specification should not be understood as a limitation of the present application.

Those skilled in the art will easily think of other embodiments of the present application after considering the description and practicing the invention disclosed herein.

The present application is intended to cover any variant, use or adaptive change of the present application. These variants, uses or adaptive changes follow the general principles of the present application and include the common knowledge or commonly used technical means in the technical field not disclosed in the present application. The description and the embodiments are only regarded as illustrative. The true scope and spirit of the present application are indicated by the following claims.

It should be understood that the present application is not limited to the precise structure described above and shown in the drawings, and various modifications and changes can be made without departing from its scope. The scope of the present application is limited only by the appended claims.

The "one embodiment", "embodiment" or "one or more embodiments" mentioned herein means that the specific features, structures or features described in combination with the embodiments are included in at least one embodiment of the present application. In addition, please note that the word "in one embodiment" does not necessarily refer to the same embodiment.

A large number of specific details are described in the instructions provided here. However, it can be understood that the embodiments of the present application can be practiced without these specific details. In some examples, the well-known methods, structures and techniques are not shown in detail so as not to obscure the understanding of this specification.

In the claims, any reference symbol between brackets shall not be constructed as a restriction on the claims. The word "comprising" does not exclude the existence of elements or steps not listed in the claims. The word "one" or "one" before a component does not exclude the existence of multiple such components. The present application can be realized by means of hardware including several different elements and by means of a properly programmed computer. In the unit claims that list several devices, several of these devices can be embodied by the same hardware item. The use of the first, second, and third words does not indicate any order. These words can be interpreted as names.

Finally, it should be noted that the above embodiments are only used to illustrate the technical solution of the present application, not to limit it. Although the present application has been described in detail with reference to the preceding embodiments, those skilled in the art should understand that they can still modify the technical solutions recorded in the preceding embodiments or replace some of the technical features equally. These modifications or substitutions do not make the essence of the corresponding technical solutions separate from the spirit and scope of the technical solutions of the embodiments of the present application.

The invention claimed is:

1. A light emitting panel, comprising:
a light emitting substrate comprising at least one light emitting region and a non-light-emitting region surrounding the light emitting region; and
an encapsulation layer arranged on a light exiting side of the light emitting substrate, wherein the encapsulation layer includes a first film layer including a plurality of pillars separated from each other and a first medium arranged in gaps between the pillars;
wherein a refractive index of the pillars is different from that of the first medium, and volume ratios of the pillars to the first medium are increasingly higher or increasingly lower along a first direction, so that an equivalent refractive index of the first film layer is increasingly lower along the first direction, wherein the first direction is a direction from a center of the light emitting region to an edge of the light emitting region;
wherein orthographic projections of the plurality of pillars and the first medium on the light emitting substrate cover the at least one light emitting region and at least part of the non-light-emitting region.

2. The light emitting panel according to claim 1, wherein the refractive index of the pillars is greater than that of the first medium, and the volume ratios of the pillars to the first medium are increasingly lower along the first direction; or,
the refractive index of the pillars is less than that of the first medium, and the volume ratios of the pillars to the first medium are increasingly higher along the first direction.

3. The light emitting panel according to claim 2, wherein the refractive index of the pillars is greater than that of the first medium; along the first direction, sizes of the pillars are increasingly lower or remain unchanged.

4. The light emitting panel according to claim 3, wherein the light emitting region is provided with a first side and a second side that are adjacent, and the first side is greater than or equal to the second side;
along a direction from the center of the light emitting region to the first side, a size attenuation rate of the pillars is a first rate;
along a direction from the center of the light emitting region to the second side, the size attenuation rate of the pillars is a second rate;
wherein the first rate is greater than or equal to the second rate.

5. The light emitting panel according to claim 1, wherein the difference between a maximum value of the equivalent refractive index and a minimum value of the equivalent refractive index of the first film layer is greater than or equal to 0.4, and less than or equal to 1.5.

6. The light emitting panel according to claim 1, wherein the light emitting panel further comprises:
a leveling layer arranged on a side of the first film layer away from the light emitting substrate;
wherein, the first medium includes gas and/or a material of the leveling layer filled in the gaps between the pillars.

7. The light emitting panel according to claim 1, wherein the refractive index of the pillars is greater than or equal to 1.5, and less than or equal to 2.5; the refractive index of the first medium is greater than or equal to 1.0, and less than or equal to 1.5.

8. The light emitting panel according to claim 1, wherein in a normal direction of the light emitting substrate, a thickness of the pillars is greater than or equal to 300 nm and less than or equal to 4000 nm; and/or
in a direction parallel to a plane where the light emitting substrate is located, sizes of the pillars are greater than or equal to 60 nm and less than or equal to 400 nm; and/or
a minimum distance between two adjacent pillars is greater than or equal to 20 nm and less than or equal to 400 nm.

9. The light emitting panel according to claim 1, wherein in a normal direction of the light emitting substrate, a thickness of the encapsulation layer is less than or equal to 4000 nm.

10. The light emitting panel according to claim 1, wherein a viewing angle range of the light emitting panel is less than that of the light emitting substrate, and the viewing angle range of the light emitting panel is less than or equal to 30°.

11. The light emitting panel according to claim 1, wherein the light emitting panel comprises a plurality of pixels, and each of the plurality of pixels includes a red sub-pixel, a blue sub-pixel and a green sub-pixel; the light emitting panel further includes:
- a color conversion layer arranged on the light exiting side of the encapsulation layer, and including:
- a first color conversion pattern in the red sub-pixel, for emitting red light when excited by incident light;
- a second color conversion pattern in the green sub-pixel, for emitting green light when excited by the incident light; and
- a transmissive pattern, in the blue sub-pixel, for transmitting the incident light;
- wherein the incident light includes blue light.

12. The light emitting panel according to claim 11, wherein the first color conversion pattern and the second color conversion pattern each comprises one or more of the group of: quantum dots, rare earth materials, fluorescent materials, and organic dyes.

13. The light emitting panel according to claim 11, further comprising:
- a color filter layer arranged on the light exiting side of the color conversion layer, and including:
- a first color filter pattern in the red sub-pixel, for transmitting the red light incident to the first color filter pattern;
- a second color filter pattern in the green sub-pixel, for transmitting the green light incident on the second color filter pattern; and
- a third color filter pattern in the blue sub-pixel, for transmitting the blue light incident to the third color filter pattern.

14. The light emitting panel according to claim 13, wherein the light emitting substrate comprises:
- a first substrate baseplate;
- a plurality of switching elements disposed on the first substrate baseplate; and
- a plurality of light emitting devices connected to the switching elements, wherein the light emitting devices are in the light emitting region; wherein the encapsulation layer is located on a light exiting side of the light emitting devices;
the light emitting panel further includes:
- a second substrate baseplate disposed on a side of the color filter layer away from the color conversion layer; and
- a leveling layer arranged between the encapsulation layer and the color conversion layer, for bonding the encapsulation layer and the color conversion layer.

15. A light emitting apparatus comprising:
the light emitting panel according to claim 1;
a driving integrated circuit configured to provide a driving signal to the light emitting panel; and
a power supply circuit configured to provide power to the light emitting panel.

16. A light emitting panel, comprising:
a light emitting substrate comprising at least one light emitting region and a non-light-emitting region surrounding the light emitting region; and
an encapsulation layer arranged on a light exiting side of the light emitting substrate, wherein the encapsulation layer includes a first film layer including a plurality of pillars separated from each other and a first medium arranged in gaps between the pillars;
wherein a refractive index of the pillars is different from that of the first medium, and volume ratios of the pillars to the first medium are increasingly higher or increasingly lower along a first direction, so that an equivalent refractive index of the first film layer is increasingly lower along the first direction, wherein the first direction is a direction from a center of the light emitting region to an edge of the light emitting region;
wherein the encapsulation layer further comprises: a barrier layer and a spacer layer stacked between the light emitting substrate and the first film layer, and the barrier layer is disposed closer to the light emitting substrate; and
the first film layer further includes a film layer body located on a side of the plurality of pillars closest to the light emitting substrate, and the film layer body and the pillars are integrally structured.

17. The light emitting panel according to claim 16, wherein the barrier layer, the spacer layer and the first film layer each comprises one or more of the group of: silicon nitride, silicon oxide, silicon oxynitride, alumina, silicon carbon nitrogen, titanium oxide, zirconium oxide, parylene, acrylic series organics and epoxy resin series organics.

18. A method for manufacturing a light emitting panel, comprising:
providing a light emitting substrate comprising at least one light emitting region and a non-light-emitting region surrounding the light emitting region;
forming an encapsulation layer on a light exiting side of the light emitting substrate, wherein the encapsulation layer includes a first film layer, the first film layer includes a plurality of pillars separated from each other and a first medium arranged in gaps between the pillars; a refractive index of the pillars is different from that of the first medium, and volume ratios of the pillars to the first medium are increasingly higher or increasingly lower along a first direction, so that an equivalent refractive index of the first film layer is increasingly lower along the first direction, the first direction is a direction from a center of the light emitting region to an edge of the light emitting region;
wherein the step of forming an encapsulation layer on a light exiting side of the light emitting substrate comprises:
forming an encapsulation material layer on the light exiting side of the light emitting substrate, wherein an orthographic projection of the encapsulation material layer on the light emitting substrate covers the light emitting substrate;
forming a metal layer on a side of the encapsulation material layer away from the light emitting substrate, wherein an orthographic projection of the metal layer on the light emitting substrate covers the light emitting substrate;
using a nanoimprint process to form a protective adhesive layer by patterning on a side of the metal layer away from the light emitting substrate;
etching the metal layer by using the protective adhesive layer as a mask to obtain a patterned metal layer;
etching the encapsulation material layer by using the patterned metal layer as a mask to form the plurality of pillars; and
removing the patterned metal layer to form the first film layer; wherein, the plurality of pillars and the first medium filled in the gaps between the pillars constitute the first film layer.

* * * * *